United States Patent
Stephens et al.

[11] Patent Number: 6,003,147
[45] Date of Patent: Dec. 14, 1999

[54] WEIGHTED INTERLEAVING FOR CORRELATED CHANNEL CODING

[75] Inventors: Scott A. Stephens; Terrence R. Smigla, both of Manhattan Beach; Donald R. Martin, Redondo Beach, all of Calif.

[73] Assignee: TRW Inc., Redondo Beach, Calif.

[21] Appl. No.: 09/109,968

[22] Filed: Jun. 25, 1998

Related U.S. Application Data

[62] Division of application No. 08/864,755, May 29, 1997.

[51] Int. Cl.$^6$ ...................................................... G06F 11/00
[52] U.S. Cl. ........................................... 714/701; 714/788
[58] Field of Search ................................... 714/701, 788; 370/535; 375/200

[56] References Cited

U.S. PATENT DOCUMENTS

| | | | |
|---|---|---|---|
| 4,547,887 | 10/1985 | Mui | 375/200 |
| 5,483,541 | 1/1996 | Linsky | 371/2.1 |
| 5,592,471 | 1/1997 | Briskman | 455/506 |

Primary Examiner—Phung M. Chung
Attorney, Agent, or Firm—Michael S. Yatsko

[57] ABSTRACT

A weighted interleaving system (10) is used for correlated channel coding. The weighted interleaving system (10) includes a weighted interleaver (12) having a pseudo-random demultiplexer (18), a first branch (28), a second branch (30), a third branch (32) and a pseudo-random multiplexer (38). The pseudo-random demultiplexer (18) receives input data bits at an input (20) and randomly distributes the input data bits to first (22), second (24) and third (26) outputs of the pseudo-random demultiplexer (18). The first branch (28) in communication with the first output (22) delays the transmission of the input data bits routed to it by a minimum delay. The second branch (30) in communication with the second output (24) delays the transmission of the input data bits routed to it by a delay uniform in probability from the minimum delay to a maximum delay. The third branch (32) in communication with the third output (26) delays the transmission of the input data bits routed to it by the maximum delay. The pseudo-random multiplexer (38) combines the input data bits received in its first (40), second (42) and third (44) inputs and routes the input data bits to an output (46).

15 Claims, 2 Drawing Sheets

WEIGHTED INTERLEAVING FOR CORRELATED CHANNEL CODING

This is a division, of application number 08/864,755, filed May 29, 1997.

BACKGROUND OF THE INVENTION

1. Field of the Invention

This invention relates generally to an interleaver for use in communication systems and, more particularly, to a weighted interleaving system for correlated channel coding.

2. Discussion of the Related Art

Communication systems are increasingly expected to be capacity efficient and heavy demands are currently required on many different types of digital communication channels. With many of these communication channels, a relatively large amount of bit errors may occur in a relatively short period of time within a sequence of transmitted bits. Errors occurring in this manner are generally referred to as burst errors, and thus, such communication channels are typically referred to as bursty or fading channels.

Traditional coding methods for communication systems operating through a bursty or fading channel often employ some form of interleaving in order to make the communication system more reliable. As is known in the art, interleaving attempts to spread the effect of burst errors in time such that the bit errors are decorrelated and separated from one another. This repositioning of error bits tends to separate the error bits so that they can be processed in conjunction with an encoding and decoding communication system. A convolutional or block decoder is able to tolerate up to some fraction of its input bits degraded or erased, known as the decoder's erasure threshold, and still provide acceptable performance, measured by bit error probability. The purpose of the conventional interleaver is thus to reduce the probability that the decoder's erasure threshold is exceeded.

Conventional uniform interleavers have an input-to-output delay distribution that is uniform in probability over an interval from 0 seconds to a maximum delay or length of the interleaver. When optimizing the performance of a conventional uniform interleaver, the only major trade involving the interleaver is its delay or length. If the interleaver is much longer than the correlation time of the channel, which is generally defined as the separation time at which fading probabilities become uncorrelated, the probability of a burst error at the output of the interleaver is small. The maximum delay or length of the interleaver is thus generally related to the fade correlation time of the channel. Although a uniform interleaver is not necessarily optimized for a particular channel, it is generally effective when the maximum delay or length is chosen to be much larger than the fade correlation time of the channel. As the fade correlation time becomes longer, it is generally not feasible to make a uniform interleaver of sufficient delay or length to provide adequate decorrelation of the faded information. With longer delays or interleaver length, a delay in data acquisition occurs. Such an information delay degrades the quality of real time signals especially in two-way voice communications. Consequently, long uniform interleavers are not well-suited to systems that require fast acquisition.

What is needed then is a weighted interleaving system for correlated channel coding which is chosen to minimize expected correlation between deinterleaver output bits without suffering from the disadvantages associated with conventional uniform interleavers. This will, in turn, increase data acquisition time; increase quality of real time signals; decrease the probability that the average erasure fraction exceeds the decoder's threshold; remove the restriction of a uniform interleaver delay; and match the length and shape of the interleaver to channel correlation statistics. It is, therefore, an object of the present invention to provide such a weighted interleaver system for correlated channel coding.

SUMMARY OF THE INVENTION

In accordance with the teachings of the present invention, a weighted interleaving system for correlated channel coding is disclosed. The weighted interleaving system utilizes a weighted interleaver and a weighted deinterleaver whose length and shape are designed to match the correlation statistics of a channel to provide optimum performance. This is basically achieved by determining a channel correlation function in time and determining the interleaver delay distribution based upon this channel correlation function.

In one preferred embodiment, a weighted interleaving system includes a weighted interleaver. The weighted interleaver includes a pseudo-random demultiplexer having an input to receive input data bits and first, second and third outputs. The pseudo-random demultiplexer randomly distributes the input data bits received at the input to the first, second and third outputs. A first branch is in communication with the first output and delays the transmission of the input bits routed to it by a minimum delay. A second branch is in communication with the second output and delays the transmission of the input bits routed to it by a delay uniform in probability from the minimum delay to a maximum delay. A third branch is in communication with the third output and delays the transmission of the input data bits routed to it by the maximum delay. A pseudo-random multiplexer has a first input in communication with the first branch, a second input in communication with the second branch and a third input in communication with the third branch. The pseudo-random multiplexer combines and routes the input data bits received at the first, second and third inputs to an output of the pseudo-random multiplexer.

Use of the present invention provides a weighted interleaving system for correlated channel coding which minimizes the expected correlation between two bits out of a deinterleaver. As a result, the aforementioned disadvantages associated with the current uniform interleavers have been substantially reduced or eliminated.

BRIEF DESCRIPTION OF THE DRAWINGS

Still other advantages of the present invention will become apparent to those skilled in the art after reading the following specification and by reference to the drawings in which.

DETAILED DESCRIPTION OF THE PREFERRED EMBODIMENT(S)

The following description of the preferred embodiments concerning a weighted interleaving system for correlated channel coding is merely exemplary in nature and is in no way intended to limit the invention or its application or uses.

Figure 1:
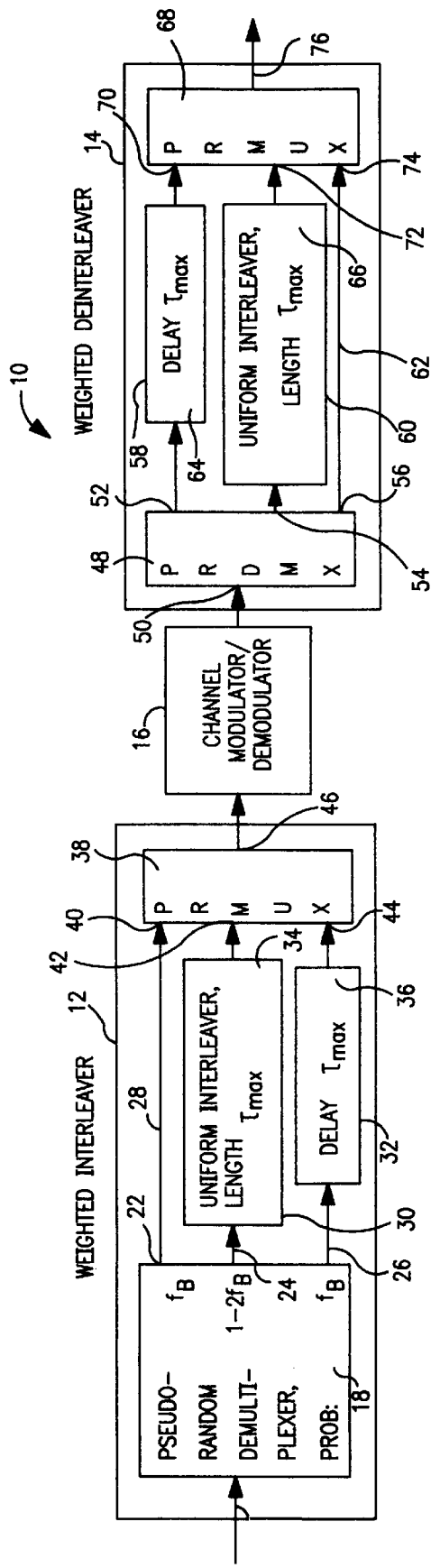
FIG. 1 is a detailed schematic block diagram of a first preferred embodiment of the present invention.

Referring to FIG. 1, a weighted interleaving system 10 according to the teachings of a first preferred embodiment in the present invention is shown. The weighted interleaving system 10 may be incorporated into various communication systems such as a satellite based system which uses an RF link that broadcasts to mobile users, as would be well understood in the art. The weighted interleaving system 10 includes a weighted interleaver 12 in communication with a complimentary weighted deinterleaver 14, via a channel modulator/demodulator 16. The channel modulator/demodulator 16 could be any known modulator/demodulator appropriate for the communication system selected.

The weighted interleaver 12 includes a pseudo-random demultiplexer 18 having an input 20, a first output ($f_E$) 22, a second output ($1-2f_E$) 24 and a third output ($f_E$) 26. The pseudo-random demultiplexer 18 receives input data bits at input 20 and psuedo-randomly distributes the input data bits to the first output 22, the second output 24 and the third output 26. The input data bits are pseudo-randomly distributed or routed to the three outputs 22, 24 and 26 according to a non-uniform probability distribution. In other words, the input data bits are distributed non-uniformly in probability between a minimum delay and a maximum delay. Specifically, the first output 22 will receive on average about 25% of the input data bits, second output 24 will receive about 50% and third output 26 will receive about 25%. As such, there is a 1:4 probability that input data bits will be distributed or routed to first output 22 and third output 26 and a 1:2 probability that the input data bits will be distributed or routed to second output 24 upon making certain assumptions, further discussed herein.

In this way, input data bits are received at a first bit rate at input 20 and distributed at outputs 22, 24 and 26, each having a bit rate which is a fraction of the first bit rate. For example, assuming 100 input data bits are received at input 20, on average, output 22 will randomly transfer about 25 of these bits, output 24 will randomly transfer about 50 of these bits and output 26 will randomly transfer about 25 of these bits. Therefore, output 22 may transfer bits 1–10, output 24 may then transfer bits 11–23, output 22 then may transfer bits 24–28, output 26 may then transfer bits 29–34, and so forth until 100 bits are pseudo-randomly distributed to the outputs with the above-identified probability distribution.

The weighted interleaver 12 further includes a first branch 28, a second branch 30, and a third branch 32. The first branch 28 is coupled to or in communication with the first output 22, the second branch 30 is coupled to or in communication with the second output 24, and the third branch 32 is coupled to or in communication with the third output 26. The first branch 28 is essentially a wire which provides substantially no delay of the data bits routed through the first branch 28. The second branch 30 includes a conventional uniform interleaver 34 having a maximum delay or length of $\tau_{max}$. The uniform interleaver 34 may be any conventional uniform interleaver such as a block or convolutional interleaver. Thus, the uniform interleaver 34 will transmit the input data bits routed to it uniform in probability from a minimum delay to a maximum delay (i.e. 0 seconds to $\tau_{max}$) similar to conventional interleavers. An example of such a conventional interleaver is set forth in U.S. Pat. No. 5,483,541, which is hereby incorporated by reference. The third branch 32 includes a maximum delay 36 of $\tau_{max}$ which may be implemented by use of a conventional buffer or shift register. Accordingly, the first branch 28 provides a minimum delay of 0 seconds, the third branch 32 provides a maximum delay 36 of $\tau_{max}$ and the second branch 30 provides a delay distributed uniformly in probability from the minimum delay to the maximum delay (i.e. 0 seconds to $\tau_{max}$) from the uniform interleaver 34.

The interleaved data bits from the first, second and third branches 28–32 are then applied to a pseudo-random multiplexer 38. The pseudo-random multiplexer 38 includes a first input 40, a second input 42, and a third input 44 each coupled or in communication with the first branch 28, the second branch 30 and the third branch 32, respectively. The pseudo-random multiplexer 38 receives the interleaved data bits from the three inputs 40–44 and combines them into a single interleaved data bit stream which is routed out of output 46. The interleaved data bits from output 46 are applied to the channel modulator/demodulator 16 which may be an RF channel link between a satellite and a mobile user. The pseudo-random multiplexer 38 is configured to combine the input data bits it receives at input 40–44 in the same fashion that they are separated at pseudo-random demultiplexer 18. Thus, the pseudo-random demultiplexer 18 and the pseudo-random multiplexer 38 are configured to have the same pseudo-random algorithm. This insures that the single data bit stream at output 46 is interleaved to match the way the input data bit stream is randomly distributed in the demultiplexer 18.

From the channel modulator/demodulator 16, the interleaved data bits are applied to the complimentary weighted deinterleaver 14. The weighted deinterleaver 14 includes a pseudo-random demultiplexer 48 which receives the interleaved data bits at an input 50. The pseudo-random demultiplexer 48 includes a first output 52, a second output 54 and a third output 56. The interleaved data bits received at input 50 are pseudo-randomly distributed or routed out of outputs 52, 54 and 56 in the same fashion as the pseudo-random demultiplexer 18. In other words, the interleaved data bits are distributed or routed out of the pseudo-random demultiplexer 48 in a way that it is the same as the way the input data bits are distributed out of the pseudo-random demultiplexer 18.

The weighted deinterleaver 14 also includes a first branch 58, a second branch 60 and a third branch 62, coupled to or in communication with the first output 52, the second output 54 and the third output 56, respectively. The first branch 58, the second branch 60 and the third branch 62 are arranged complimentary or opposite of the first branch 28, the second branch 30 and the third branch 32. This complimentary orientation of the branches enables the interleaved data bits to be reconstructed or lined up in the way the data bits were prior to interleaving in the weighted interleaver 12.

Accordingly, the first branch 58 includes a delay 64 of $\tau_{max}$, the second branch 60 includes a uniform deinterleaver 66 having a length or maximum delay of $\tau_{max}$ (i.e., 0 seconds to $\tau_{max}$) and the third branch 62 has a minimum delay of substantially 0 seconds. The data bits out of branches 58–62 are then applied to a pseudo-random multiplexer 68 at a first input 70, a second input 72 and a third input 74. The pseudo-random multiplexer 68 rearranges the data bits into a deinterleaved data bit stream similar to that received at input 20. This data bit stream is then applied to output 76 of the pseudo-random multiplexer 68. Here again, the pseudo-random multiplexer 68 has the same pseudo-random algorithm as the demultiplexer 18, multiplexer 38 and demultiplexer 48.

The method of determining the shape and length of the weighted interleaving system 10 to generate or construct the weighted interleaver 12 and weighted deinterleaver 14 will now be described. The shape and length of the weighted interleaver 12 and the weighted deinterleaver 14 is matched to the correlation statistics of the channel 16 to provide optimum performance. A conventional or block decoder (not shown) which would generally be coupled to the output 76 of the pseudo-random multiplexer would be able to tolerate up to some fraction of its input bits degraded or erased and still provide acceptable performance, measured by its bit error probability. This fraction is called the decoder's erasure threshold. The purpose of an interleaver is to reduce the probability that this erasure threshold is exceeded. If the interleaver has a delay or length τ and burst or fades occur over some fraction of this length τ, then the expected probability of erasure of any given interleaver output bit will just be this fraction. The decoder's performance is dependent not on the instantaneous probability of a single bit erasure, but instead on the expected probability averaged over its processing time, typically at least several bits.

This average erasure probability will then have a probability of distribution, which is dependent on the channel statistics and the length and shape of the interleaver selected. Minimizing the probability that this average erasure fraction exceeds the decoder's threshold is, to first order, the same as minimizing the width of the erasure fraction distribution. The width of the erasure fraction distribution is minimized by minimizing the average correlation of erasure over the decoder's averaging time. Thus, the shape of the weighted interleaver 12 is chosen to minimize expected correlation between the weighted deinterleaver's 14 output bits.

Consider a generic interleaver which pseudo-randomly chooses a delay τ from a distribution ρ (τ), which implies that the delay selections are independent. If the channel 16 has an impairment (for example, noise burst or a signal fade) with a channel correlation function in time $R(\tau,\tau')$, then the expected correlation between two bits out of a deinterleaver is given by:

$$\langle \rho \rangle = \int \int d\tau d\tau' \rho(\tau') R(\tau, \tau') \qquad [1]$$

Minimizing this expected impairment correlation will maximize the probability that a decoder coupled to the weighted deinterleaver 14 will be able to correctly produce valid information bits. Thus, the delay distribution of the weighted interleaving system 10 is derived to yield optimum performance for a specific given channel.

To practically implement the weighted interleaving system 10, it is necessary to constrain either the maximum delay ($\tau_{max}$) or the required amount of memory (M/B) for the weighted interleaving system 10. If the constraint selected is for an interleaver time delay constraint, equation 1 becomes:

$$\langle \rho \rangle = \int_O^{\tau_{max}} \int_O^{\tau_{max}} d\tau d\tau' \rho(\tau)\rho(\tau') R(\tau, \tau') \qquad [2]$$

where the interleaver time delay constraint is $T_{max}$. With a memory constrained interleaver, equation 1 is minimized with the constraint:

$$\int d\tau \; \tau \cdot \rho(\tau) = \bar{\tau} = \frac{M}{B} \qquad [3]$$

where $\bar{\tau}$ is the average delay of the interleaver which is equal to the total memory M of the weighted interleaver 12 in bits divided by the information rate B in bits per second.

Assuming that the weighted interleaving system 10 is incorporated into a satellite mobile link communication system operating through a bursty, fading or any other correlated noise/impairment channel, the weighted interleaving system 10 will optimize such a communication link.

With a satellite mobile link which to a good approximation is either in clear line-of-sight or blocked, can be described by the known two-state Markov process. The corresponding correlation function of such a channel or mobile link is given by:

$$R(\tau,\tau')=e^{-|\tau-\tau'|/T_{blockage}} \qquad [4]$$

where $\bar{T}_{blockage}$ is the mean blockage time. The weighted interleaving system 10 having a maximum delay $\tau_{max}$ minimizes the expected deinterleaver output correlation utilizing a delay distribution function:

$$\rho(\tau) = f_E \delta(\tau) + (1 - 2f_E)\frac{1}{\tau_{max}} \Pi\left(\frac{\tau}{\tau_{max}}\right) + f_E \delta(\tau - \tau_{max}) \qquad [5A]$$

where $$\Pi(\tau) = \begin{pmatrix} 1 & 0 \leq \tau \geq 1 \\ 0 & \text{otherwise} \end{pmatrix} \quad f_E = \frac{1}{\tau_{max}/\bar{T}_{blockage} + 2} \qquad [5B]$$

By setting the maximum interleaving delay $\tau_{max}$ to be twice the channel correlation time $\bar{T}_{blockage}$, the fraction of input data bits ($f_E$) blockage with a minimum delay of 0 seconds and with a maximum delay of $\tau_{max}$ is one-quarter or 25% (i.e. outputs 22 or 26). This enables a mobile receiver which incorporates the weighted deinterleaver 14 to have an interleaving delay of 0 seconds for one-fourth or 25% of the encoded data bits received by the receiver. This information is immediately available for decoding, and a decoder with a moderate fade margin will be able to recover the transmitted information with effectively zero latency, providing increased or faster data acquisition time.

In summary, the method of constructing or generating the weighted interleaving system 10 will include the following steps. First, the expected correlation <ρ> between two consecutive data bits out of an interleaver is first provided by equation 1. A channel correlation function in time $R(\tau,\tau')$ is then determined based upon the communication system and channel link utilized. This channel correlation function, shown here as equation 4, may change depending on the communication system and channel link utilized. To realize the weighted interleaving system 10, the expected correlation <τ> (eq. 1) is constrained by either the maximum delay $\tau_{max}$ of the interleaver or the required memory (M/B) for the interleaver, as set forth in equations 2 and 3. Given the channel correlation function $R(\tau,\tau')$ (eq. 4) and the expected correlation <τ> (e.g., 1) constrained by the maximum delay $\tau_{max}$ (eq. 2), the interleaver delay distribution ρ (r) (eqs. 5A and 5B) is solved for to minimize the correlation between two consecutive bits using known calculus of variations to yield equations 5A and 5B.

From equations 5A and 5B, one can generate or construct the weighted interleaver 12. For the satellite-to-mobile channel described by the two-state Markov process, the interleaver delay distribution ρ (τ) yields three paths consisting of:

$$f_E \delta(\tau) \qquad [A]$$

$$(1 - 2f_E)\frac{1}{\tau_{max}} \Pi\left(\frac{\tau}{\tau_{max}}\right) \qquad [B]$$

$$f_E \delta(\tau - \tau_{max}) \qquad [C]$$

This corresponds to the three branches in the weighted interleaver 12 consisting of branches 28, 30 and 32. Part A identifies a fraction of bits with the minimum delay or delta delay of 0 seconds, corresponding to first branch 28. Part B identifies a fraction of the bits having a uniform probability distribution from the minimum delay to the maximum delay (i.e. 0 seconds to $\tau_{max}$), which corresponds to the second branch 30 and may be implemented by the uniform interleaver 34. Part C identifies a fraction of the bits having a maximum delay (i.e. $\tau_{max}$), corresponding to the third branch 32, which may be implemented with a delay $\tau_{max}$ 36.

Setting the maximum interleaving delay $\tau_{max}$ to twice the channel correlation time $\overline{T}_{blockage}$, a fraction of bits with 0 or maximum delay is one-quarter or 25% by solving for $f_E$ in equation 5B. This provides a probability of distribution of one-quarter for outputs 22 and 26 leaving a probability distribution of one-half or 50% for output 24. Alternatively, should the maximum delay $\tau_{max}$ be set to a different number, as well as the channel correlation time $\overline{T}_{blockage}$, the probability of distribution out of the outputs 22, 24 and 26 may be different.

Figure 2:
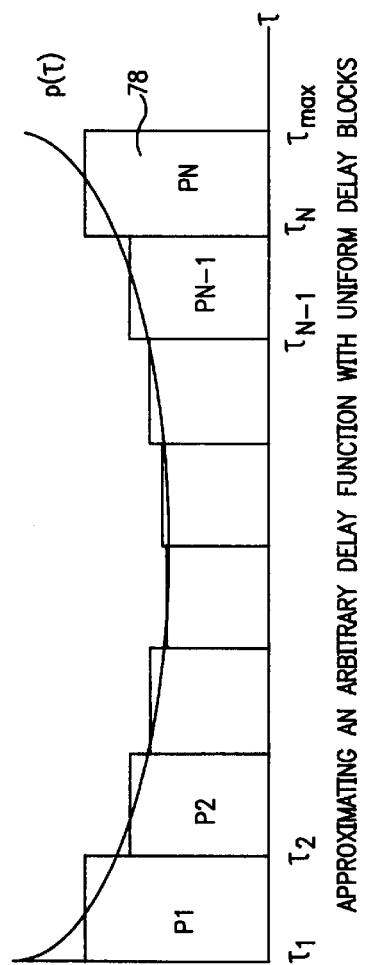
FIG. 2 is a graph representing an interleaver delay distribution function $\rho(\tau)$.

The delay structure described above is not a general solution for all fading channels. Consequently, the first step in implementing the weighted interleaver is to measure the channel correlation. The next step is to solve equation 1 with the appropriate constraints thereby arriving at a delay distribution ρ (τ). The following is a technique for implementing an arbitrary interleaver delay distribution using several uniform interleavers. Such a method computes the probability of having a delay in N bins or samples spaced uniformly from τ=0 to τ=$\tau_{max}$ with:

$$\Delta \tau = \frac{\tau_{max}}{N} \quad [6]$$

$$\tau_i = \Delta \tau \cdot (i-1) \quad i=1, 2, \ldots, N$$

$$\rho_i = \int_{\tau_i}^{\tau_i + \Delta \tau} d\tau \, \rho(\tau)$$

where Δτ equals the delay or length of the uniform interleavers utilized, N equals the number of bins or samples taken for the function ρ (τ), and $\rho_i$ represents the probability of the interleaver delay bits falling between $\tau_i$ and $\tau_i+\Delta\tau$. This approximation of ρ (τ), thus utilizes piecewise constant steps, as is shown in FIG. 2 to approximate the interleaver delay distribution ρ (τ).

Each of the steps 78 or rectangles have a uniform delay density over their width, each of which can be realized utilizing a uniform interleaver. The particular shape of ρ (τ) shown in FIG. 2 is selected based upon the following assumptions. First, assuming that a data bit may be blocked by interference in a mobile communication link such as by a tree, once a data bit is blocked, there is a high probability that a subsequent adjacent data bit will also be blocked since you will still probably be passing by the interfering object. Accordingly, it would be desirable to separate each consecutive bit as far apart as possible thus corresponding to the function ρ (τ) shown in FIG. 2, where there is a high probability for routing to either the minimum or maximum delays, thereby providing maximum decorrelation between the input data bits. Should other environments be known such as when a vehicle would travel down a path with adjacent interferences occurring uniformly such as with telephone poles, it may be desirable to shape the function ρ (τ) as a sinusoidal function. It should further be noted that the N samples could be increased to better approximate the function ρ (τ) and the spacing of the samples by AT also does not require them to be uniform.

Figure 3:
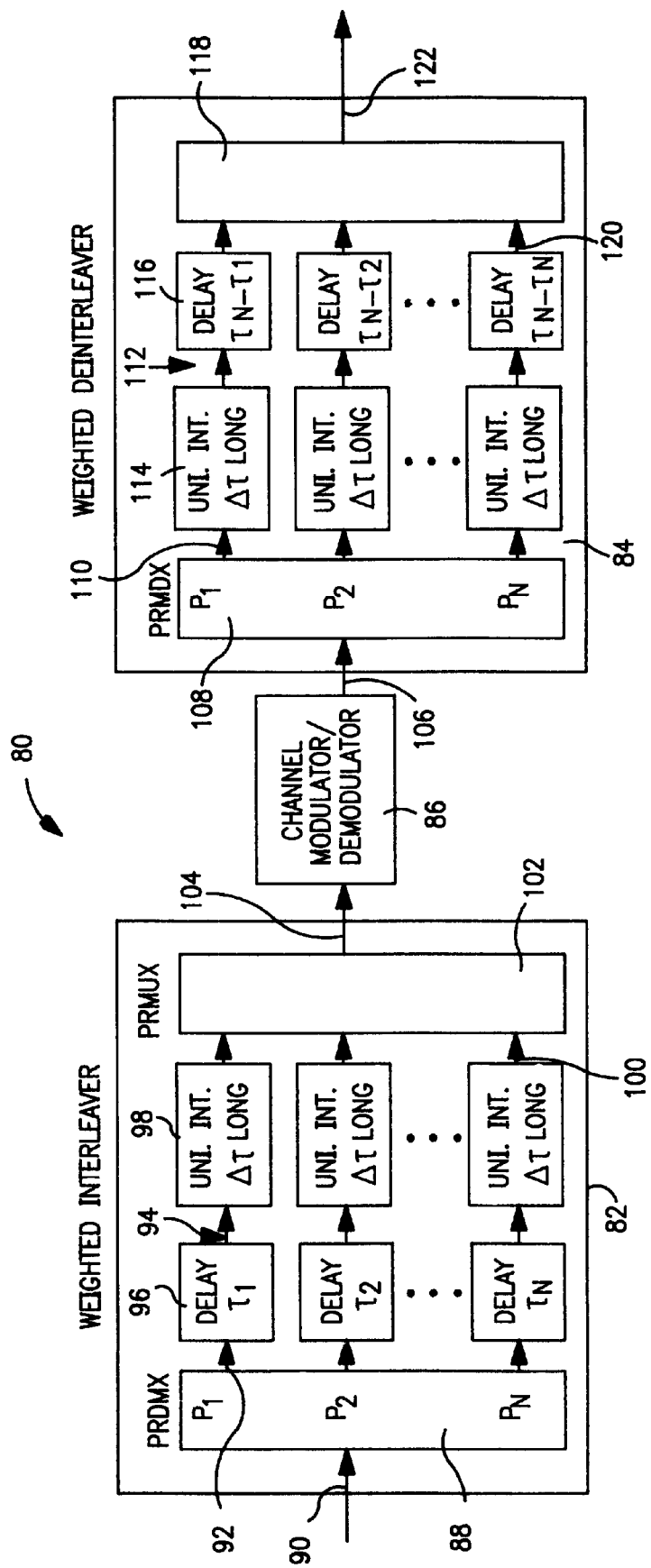
FIG. 3 is a detailed schematic block diagram of a second preferred embodiment of the present invention modeled from the delay distribution function $\rho(\tau)$ of FIG. 2.

From the above, a weighted interleaving system 80 can be constructed as shown in FIG. 3, corresponding to the second preferred embodiment of the present invention. Here again, the weighted interleaving system 80 includes a weighted interleaver 82 in communication with a weighted deinterleaver 84, via a channel modulator/demodulator 86. The weighted interleaver 82 includes a pseudo-random demultiplexer 88 having an input 90 to receive input data bits. The pseudo-random demultiplexer 88 randomly distributes or routes the input data bits received at input 90 to N number of outputs 92 with a probability distribution $\rho_i$. For example, assuming there are eight outputs 92 with eight steps or rectangles 78, as shown in FIG. 2, $\rho_1$ and $\rho_8$ will have a higher probability of receiving more input data bits versus $\rho_4$ and $\rho_5$, based upon the area of the rectangles 78.

Each N output 92 is coupled to or in communication with a branch 94. Each branch 94 includes a delay $\tau_N$ 96 and a uniform interleaver 98 having a length or delay of Δτ. With N equal to eight, and Δτ being uniform or equal to one, $\tau_{max}$ also equals eight. Thus, delay $\tau_1$ will be a delay of zero seconds while $\tau_2$ will be a delay of one second and so forth and each uniform interleaver will have a length or delay of Δτ or one second. The data bits from each branch 94 are then applied to N inputs 100 of pseudo-random multiplexer 102. The pseudo-random multiplexer 102 combines the delayed input data bits in the same fashion as the pseudo-random demultiplexer 88 separates the input data bits and applies the combined interleaved input data bits to an output 104 through the channel modulator/demodulator 86.

From the channel modulator/demodulator 86, the interleaved data bits are applied to an input 106 of a pseudo-random demultiplexer 108 in the weighted deinterleaver 84. The pseudo-random demultiplexer 108 separates the interleaved data bit stream following the same pseudo-random pattern as the pseudo-random demultiplexer 88 and applies these to N outputs 110. Each output 110 is in communication with a complimentary branch 112, each having a uniform interleaver 114, with a length or delay Δτ and a delay 116 with a delay opposite the delay in the weighted interleaver 82 (i.e., $\tau_N-\tau_1$, . . . ). The complimentary branches 112 having opposite delays deinterleaves the interleaved data bit stream from input 106 which are applied to a pseudo-random multiplexer 118 having N inputs 120. The pseudo-random multiplexer 118 also combines the data bits in the same fashion that the pseudo-random demultiplexer 88 separates the data bits such that a deinterleaved data bit stream is then applied to an output 122 of the pseudo-random multiplexer 118 which would subsequently be applied to a decoder (not shown).

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

What is claimed is:

1. A weighted interleaving system for correlated channel coding, said weighted interleaving system comprising:
   a weighted interleaver having,
   a pseudo-random demultiplexer having an input to receive input data bits and a first output, a second output and a third output, said pseudo-random demultiplexer operable to distribute said input data bits received at said input to said first output, said second output and said third output non-uniformly in probability between a minimum delay and a maximum delay;
   a first branch in communication with said first output, said first branch operable to delay the transmission of said input data bits routed to said first branch by said minimum delay;

a second branch in communication with said second output, said second branch operable to delay the transmission of said input data bits routed to said second branch by a delay uniform in probability from said minimum delay to said maximum delay;

a third branch in communication with said third output, said third branch operable to delay the transmission of said input data bits routed to said third branch by said maximum delay; and a pseudo-random multiplexer having a first input in communication with said first branch, a second input in communication with said second branch and a third input in communication with said third branch, said pseudo-random multiplexer operable to combine and route said input data bits received at said first input, said second input and said third input to an output of said pseudo-random multiplexer.

2. The weighted interleaving system as defined in claim 1, wherein said input data bits are received at an input data bit rate and distributed out of said first, second and third outputs each at a fraction of said input data bit rate.

3. The weighted interleaving system as defined in claim 1, wherein said second branch includes a uniform interleaver having a length equal to said maximum delay.

4. The weighted interleaving system as defined in claim 1, wherein said third branch includes a buffer for delaying the transmission of said input bits routed to said third branch by said maximum delay.

5. The weighted interleaving system as defined in claim 1, wherein said pseudo-random multiplexer combines said input data bits received at said first input, said second input and said third input the same as said pseudo-random demultiplexer distributes said input data bits to said first output, said second output and said third output.

6. The weighted interleaving system as defined in claim 1, further comprising a weighted deinterleaver being complimentary to said weighted interleaver.

7. The weighted interleaving system as defined in claim 1, wherein a length and shape of said weighted interleaver is matched to an average channel correlation function of a channel to provide optimal performance.

8. The weighted interleaving system as defined in claim 7, wherein said length and shape of said weighted interleaver is matched to a channel correlation function described by a two-state Markov process.

9. The weighted interleaving system as defined in claim 8, wherein said channel correlation function is $R(\tau,\tau')=e^{-|\tau-\tau'|/T_{blockage}}$ where $T_{blockage}$ is a mean blockage time.

10. The communication system as defined in claim 7, wherein said weighted interleaver is constrained by a maximum delay having a delay distribution designed to minimize the following function:

$$\langle \rho \rangle = \int_O^{\tau \max} \int_O^{\tau \max} d\tau d\tau' \rho(\tau)\rho(\tau')R(\tau,\tau')$$

where $\rho(\tau)$ equals probability density function of time delays through weighted interleaver and $R(\tau,\tau')$ equals channel correlation function of signal fades.

11. The communication system as defined in claim 7, wherein said weighted interleaver is constrained in memory whereby a delay distribution is determined by minimizing the following function:

$$\langle \rho \rangle = \int_O^{\tau \max} \int_O^{\tau \max} d\tau d\tau' \rho(\tau)\rho(\tau')R(\tau,\tau')$$

with the constraint that:

$$\int d\tau \, \tau \cdot \rho(\tau) = \overline{\tau} = \frac{M}{B}$$

where $\rho(\tau)$ equals probability density function of time delays through weighted interleaver and $R(\tau,\tau')$ equals channel correlation function of signal fades.

12. A weighted interleaving system for correlated channel coding, said weighted interleaving system comprising:

a weighted interleaver having, a pseudo-random demultiplexer having an input to receive input data bits and a plurality of outputs, said pseudo-random demultiplexer operable to pseudo-randomly distribute said input data bits received at said input to said plurality of outputs according to a non-uniform probability distribution;

a branch in communication with each output of said pseudo-random demultiplexer, each of said branches having a delay and a uniform interleaver; and a pseudo-random multiplexer having a plurality of inputs, each of said inputs in communication with a branch, said pseudo-random multiplexer operable to combine and route said input data bits received at said plurality of inputs to an output of said pseudo-random multiplexer.

13. The weighted interleaving system as defined in claim 12, wherein each of said uniform interleavers has a same maximum delay or length.

14. The weighted interleaving system as defined in claim 12, wherein each of said delays has a different delay.

15. The weighted interleaving system as defined in claim 12, further comprising a weighted deinterleaver operating complimentary to said weighted interleaver.

* * * * *